United States Patent
Shokrollahi (10) Patent No.: US 7,412,641 B2
(45) Date of Patent: Aug. 12, 2008

(54) PROTECTION OF DATA FROM ERASURES USING SUBSYMBOL BASED CODES

(75) Inventor: M. Amin Shokrollahi, San Jose, CA (US)

(73) Assignee: Digital Fountain, Inc., Fremont, CA (US)

(*) Notice: Subject to any disclaimer, the term of this patent is extended or adjusted under 35 U.S.C. 154(b) by 589 days.

(21) Appl. No.: 11/003,001

(22) Filed: Dec. 1, 2004

(65) Prior Publication Data

US 2005/0219070 A1    Oct. 6, 2005

Related U.S. Application Data

(60) Provisional application No. 60/526,452, filed on Dec. 2, 2003, provisional application No. 60/526,218, filed on Dec. 1, 2003.

(51) Int. Cl.
*H03M 13/05* (2006.01)
(52) U.S. Cl. ............................................. 714/776
(58) Field of Classification Search ................. 714/776
See application file for complete search history.

(56) References Cited

U.S. PATENT DOCUMENTS 5,524,025 A    6/1996  Lawrence et al.
5,642,365 A *  6/1997  Murakami et al. .......... 714/761

(Continued)

FOREIGN PATENT DOCUMENTS

WO    WO 96/34463 A1   10/1996

OTHER PUBLICATIONS

Roth, R., et al., "A Construction of Non-Reed-Solomon Type MDS Codes", IEEE Transactions of Information Theory, vol. 35, No. 3, May 1989, pp. 655-657.*
Roth, R., "On MDS Codes via Cauchy Matrices", IEEE Transactions on Information Theory, vol. 35, No. 6, Nov. 1989, pp. 1314-1319.*
Feng, G., Error Correcting Codes over Z2m for Algorithm-Based Fault-Tolerance, IEEE Transactions on Computers, vol. 43, No. 3, Mar. 1994, pp. 370-374.*

(Continued)

*Primary Examiner*—Stephen M. Baker
(74) *Attorney, Agent, or Firm*—Philip H. Albert; Townsend and Townsend and Crew, LLP (57) ABSTRACT

An encoder uses output symbol subsymbols to effect or control a tradeoff of computational effort and overhead efficiency to, for example, greatly reduce computational effort for the cost of a small amount of overhead efficiency. An encoder reads an ordered plurality of input symbols, comprising an input file or input stream, and produces output subsymbol. The ordered plurality of input symbols are each selected from an input alphabet, and the generated output subsymbols comprise selections among an output subsymbol alphabet. An output subsymbol is generated using a function evaluator applied to subsymbols of the input symbols. The encoder may be called one or more times, each time producing an output subsymbol. Output subsymbols can then be assembled into output symbols and transmitted to their destination. The functions used to generate the output subsymbols from the input subsymbols can be XOR's of some of the input subsymbols and these functions are obtained from a linear code defined over an extension field of GF(2) by transforming each entry in a generator or parity-check matrix of this code into an appropriate binary matrix using a regular representation of the extension field over GF(2). In a decoder, output subsymbols received by the recipient are obtained from output symbols transmitted from one sender that generated those output symbols based on an encoding of an input sequence (file, stream, etc.).

16 Claims, 5 Drawing Sheets

U.S. PATENT DOCUMENTS

| | | | |
|---|---|---|---|
| 6,005,477 | A | 12/1999 | Deck et al. |
| 6,079,042 | A * | 6/2000 | Vaman et al. .............. 714/755 |
| 6,088,330 | A * | 7/2000 | Bruck et al. ............... 370/228 |
| 6,307,487 | B1 | 10/2001 | Luby |
| 7,240,236 | B2 * | 7/2007 | Cutts et al. .................... 714/6 |
| 7,254,754 | B2 * | 8/2007 | Hetzler et al. .............. 714/710 |
| 2003/0058958 | A1 | 3/2003 | Shokrollahi et al. |

OTHER PUBLICATIONS

Blömer et al. "An XOR-based erasure-resilent coding scheme" Technical report, TR-95-048, 1995, pp. 1-19, XP002181848.

Pless and WC Huffman EDS V S: Algebraic geometry codes, Handbook of Coding Theory, 1998, pp. 871-961, XP002300927.

* cited by examiner

| 0 | 1 | α | 1 | α² |
|---|---|---|---|---|
| 1 | 0 | 1 | α | α |

Figure 3A

| 0 | 0 | 1 | 0 | 0 | 1 | 1 | 0 | 1 | 1 |
|---|---|---|---|---|---|---|---|---|---|
| 0 | 0 | 0 | 1 | 1 | 1 | 0 | 1 | 1 | 0 |
| 1 | 0 | 0 | 0 | 1 | 0 | 0 | 1 | 0 | 1 |
| 0 | 1 | 0 | 0 | 0 | 1 | 1 | 1 | 1 | 1 |

PROTECTION OF DATA FROM ERASURES USING SUBSYMBOL BASED CODES

CROSS-REFERENCES TO RELATED APPLICATIONS

This application claims priority from the following co-pending U.S. Provisional Patent Applications: U.S. Provisional Patent Application No. 60/526,218 filed Dec. 1, 2003 entitled, "Protection of Data From Erasures Using Interleaved Transformations and Codes From Algebraic Geometry"; and U.S. Provisional Patent Application No. 60/526,452 filed Dec. 2, 2003 entitled, "Protection of Data From Erasures Using Interleaved Transformations and Codes From Algebraic Geometry", both of which are hereby incorporated by reference, as if set forth in full in this document, for all purposes.

This application also references commonly-owned patents and applications including: U.S. Pat. No. 6,307,487 entitled "Information Additive Code Generator and Decoder for Communication Systems" issued to Luby (hereinafter "Luby I") and U.S. Pat. No. 7,068,729 entitled "Multi-Stage Code Generator and Decoder for Communication Systems" for Shokrollahi et al. (hereinafter "Shokrollahi I"), each of which is hereby incorporated by reference, as if set forth in full in this document, for all purposes.

BACKGROUND OF THE INVENTION

Transmission of data through impaired networks has been the subject of much investigation. On many networks of computers, such as the Internet, or any other packet-based network, data is transmitted by first subdividing it into packets and then routing the packets independently through the network to the destination. In such a network there is often an expectation of loss of packets. Packets might be lost due to errors on the physical layer of transmission, due to overflow at a router or other network point causing equipment to drop packets, etc. To ensure that data is received completely, mechanisms are often used to protect the data from such losses. In general, the unit of loss is the packet, in that a packet is either received properly or it is deemed lost and steps are taken to deal with the loss of the entire packet. Thus, if bits of a packet are received but the packet is not completely received correctly, the entire packet is deemed lost. Loss can be in the form of missing a packet entirely or can be in the form of determining that there are errors in the packet creating unreliable bits, i.e., erasures and errors.

Recently, two types of codes were suggested to protect the data when there is an expectation that data would be lost during the transmission: chain reaction codes and multi-stage chain reaction codes. For a given content with k symbols, these codes produce an effectively unlimited stream of output symbols such that recovery of the original k symbols is possible from reception of any set of distinct output symbols whose cumulative number is roughly equal to k. Unless otherwise indicated, it should be understood that references to a "chain reaction code" or "chain reaction codes" as used herein could apply to chain reaction codes, such as those described in Luby I and/or elsewhere, and could also apply to multi-stage chain reaction codes, such as those described in Shokrollahi I.

With chain reaction codes, the number of output symbols possible for a given set of k input symbols input is said to be "effectively unlimited" because in nearly all cases, the number of possible output symbols can be so large relative to he number of output symbols that actually get generated or are used for input symbol recovery is much less than the number of possible symbols. For example, if input symbols code for 10,000 bits and the typical expected transmissions are files or streams up to 10 gigabit in size, an encoder should be designed to handle inputs of k=1,000,000 symbols. Such an encoder might be configured to be able to generate up to $2^{32}$ (4 billion) output symbols without having to repeat. If that is not enough, the encoder can be configured to be able to generate more output symbols without having to repeat. Of course, since all physically realizable systems are finite, an encoder will eventually reach a state where it repeats, but that state can always be designed such that, for any expected transmission and error rate, the number of output symbols without repeating is effectively unlimited.

Herein, packets can carry one symbol or multiple symbols. While it is not required, the number of bits coded for in an input symbol and the number of bits coded for in an output symbol can be the same.

In some embodiments, these codes encode the data by performing XOR's on the input symbols and they decode by performing XOR's on the received symbols, but other operations might be used as well or instead. XOR is a useful operation, as it is quick and reversible. Other operations might also provide these advantages.

These codes solve the problem of distributing data from one or more senders to one or more receivers on an impaired network in which the loss rate is unknown to the sender or to the receiver. One reason for this is this, with the large number of output symbols possible relative to the number of input symbols, a receiver would, with overwhelming odds, not duplicate the packets sent by another receiver even without any coordination among the receivers. This property is referred to as the receivers being "information additive".

In some cases, it may not be necessary or desirable to produce an effectively unlimited number of output symbols from the given content. For example, where a receiver is time constrained, it may not have the luxury of waiting for additional symbols to arrive after a given time interval. Such is the case, for example, when a live movie is sent to one or multiple receivers. Due to the nature of the live transmission, it may be impossible to always wait for enough encoding data to arrive at the receiver, because the receiver's feed has to be synchronized with that of the sender and cannot be interrupted indefinitely. In such cases, where there is expectation of loss, the sender may add a fixed additional amount of redundant symbols to the content, and transmit the content together with the redundant symbols. If the amount of loss during the transmission of the content is no larger than the number of redundant symbols, then there is an expectation of recovery of the lost data at the receiver.

This problem can also be solved with chain reaction codes. In such cases, the encoder only generates a fixed amount of encoded data, rather than an effectively unlimited stream. However, in some cases a different solution may be preferable. For example, due to the probabilistic nature of the decoding processes for chain reaction codes, these processes may incur some additional overhead for very small content sizes.

Reed-Solomon codes ("RS codes") are a class of codes that have been used to deal with transmission or storage of data that is subject to erasures between a coder output and a decoder input. Throughout this disclosure, it should be understood that coding is not limited to transmission, but of representing original data at an encoder separated in time, place, etc., from a decoder by a channel that might exhibit erasures and/or errors as the encoded data passes through the channel. RS codes have been extensively studied by a large number of researchers for many conditions, data and channels, and they are known to have certain properties.

One such condition is what is described as an "optimality condition". RS codes do not operate on binary fields but rather operate on larger Galois Fields. One of the basic properties of RS codes is that they satisfy an optimality condition such that when k symbols are encoded with an RS code, yielding n<k symbols for storage or transmission, the original k symbols can be recovered with certainty from any possible combination of k distinct received symbols of the encoded n symbols. Since the original k symbols cannot be recovered from fewer than k distinct received symbols, the number of received symbols is thus considered "optimal".

This optimality comes at a price, in that the number of operations required for encoding is large and grows larger with longer codes (i.e., with larger Galois Fields). With RS codes, a maximal block length, n, is determined ahead of time, where the block length is the number of output symbols generated from the original k input symbols. Note that if more than n-k output symbols are lost, the original k input symbols cannot be recovered. The block length, n, cannot be arbitrarily lengthened to deal with any expected condition, as computation becomes more difficult for larger block lengths and is impractical for very large block lengths.

It can be shown that, for a Reed-Solomon code defined over the Galois Field $GF(2^A)$ with block length n and dimension k, the number of XOR's of symbols to produce an output symbol is, on average, equal to $k*(n-k)*A/(2*n)$. Using such a Reed-Solomon code, k input symbols are used to produce in total n output symbols, where typically the k input symbols are included among the n output symbols and n is greater than k. In contrast, when using a chain reaction code, the average number of XOR's of symbols to produce an output symbol is equal to a constant independent of k or the number of produced output symbols. Similar results also hold for the decoder.

The length n of the Reed-Solomon code cannot exceed $2^A+1$. This latter condition, together with the fact that A is often chosen to be a power of two, may slow down the encoding and the decoding process considerably at times. For example, suppose that the original content is 32 KB in size (where 1 KB=1024 bytes), each packet can encode for encodes for 1 KB of input data and a total of 48 packets are to be sent. In this example, the content might be partitioned into thirty-two 1 KB chunks (each allocated to one packet to be sent), and then each chunk might be further subdivided into X input symbols. The Reed-Solomon coding process can then be applied in parallel X times, each time operating on one input symbol from each chunk (such as operating on all of the first input symbols of each chunk, then the second input symbol of each chunk, etc.), meaning that each operation takes into account thirty-two input symbols. Suppose this produces sixteen additional output symbols for each of the X positions, and each group of X output symbols are placed together to produce 16 additional packets that are to be sent, each of length 1 KB. In this example, the smallest acceptable A that is a power of 2 would be A=8, because for A=4 we would have $2^A+1=_{17}$, which is less than 48. The Reed-Solomon code in this case operates in the field GF(256), and thus each symbol is one byte long and X=1024. As shown by this example, while these codes might satisfy the optimality condition, they require considerable computation and have constraints on the length of codes possible.

A few concepts of coding bear introduction. Transmission granularity refers to the size of the objects transmitted and received as a unit. For example, packet networks send and receive data in packets. Even if only some of the bits of a packet are erased or corrupted, the whole packet is discarded and mechanisms (forward error correction, request for resend, etc.) are activated to recover the packet as a whole. Thus, such objects are either received error-free or are erased in their entirety. In some applications, the object size could be the size of the transmission packets or could be smaller. Where there is an expectation of correlation of loss between transmission packets, the transmission granularity can be larger than the packet size. In other applications, the transmission granularity could be smaller than the packet size.

Computational granularity refers to the size of the objects operated upon in encoders and/or decoders. Thus, if the basic operation of an encoder is XOR'ing 128-byte units, then that is the computational granularity. A symbol (which might be a packet, for example) comprising 1024 bytes sub-divided into 128-byte subsymbols would be a symbol divided into eight subsymbols (if all of the subsymbols are of the same size, which might not be required, but is simpler) and XOR's are performed on these subsymbols. The computational granularity is thus 128-bytes.

One of the reasons for the optimality of Reed-Solomon codes is in a relation between their transmission granularity and their computational granularity. An example will illustrate this point.

Consider a Reed-Solomon code over the field GF(256) that is used to encode a given file and transmit the encoded information through a channel in packets of size 1024 bytes each. The computational granularity in this case could be equal to 128 bytes (1024 bytes divided by 8), whereas the transmission granularity equals 1024 bytes. In this case, basic operations such as the XOR of sequences of bits are performed on 128 byte units as a whole.

Typically, efficiency of encoding and decoding varies with computational granularity. Efficiency can be measured in many ways, but one way of measuring it is by the average number of operations to encode or decode units of data. Often, encoding and decoding is less efficient for finer computational granularity and more efficient for coarser computational granularity. However, codes with finer computational granularity can provide better reception overhead, i.e., the excess of the number of symbols that need to be received to ensure correct decoding over the number of symbols representing the data provided to the encoder can be kept very small. As a result, there is a trade off between coding efficiency and transmission overhead for a given code.

Reed-Solomon codes are at one end of this coding trade-off, as computational granularity small enough that optimal recovery of data in face of erasures is guaranteed (upon receipt of as much data as was encoded. At the other end, codes defined over the binary alphabet (such as those used for transmission over packet networks) have a computational granularity as large as the transmission granularity, but might be inefficient in the reception overhead required to ensure complete decoding.

As mentioned above, Reed-Solomon codes require that a maximal error rate be determined in advance, i.e., if k symbols are encoded into n RS-symbols, an error rate of greater than (n-k)/n would cause a decoder to fail to recover the transmitted data. Thus, in a transmission system that is measured by the final probability of unsuccessful recovery of the transmitted data, Reed-Solomon codes exhibit a positive failure probability despite their optimality. This is because there is a positive probability that the amount of data received by the receiver is genuinely smaller than the transmitted data. As a result, in the end, a coding system might have less efficient coding and still have a failure probability that needs to be lowered.

What is therefore needed is a coding system and methods for encoding and decoding data sent through a channel wherein computational effort and overhead efficiency can be traded off as needed for particular applications, available processing power and data sets.

BRIEF SUMMARY OF THE INVENTION

In one embodiment of a communications system according to the present invention, an encoder uses output symbol subsymbols to effect or control a tradeoff of computational effort and overhead efficiency to, for example, greatly reduce computational effort for the cost of a small amount of overhead efficiency. An encoder reads an ordered plurality of input symbols, comprising an input file or input stream, and produces output subsymbol. The ordered plurality of input symbols are each selected from an input alphabet, and the generated output subsymbols comprise selections among an output subsymbol alphabet. An output subsymbol is generated using a function evaluator applied to subsymbols of the input symbols. In some embodiments, the encoder may be called one or more times, each time producing an output subsymbol. Output subsymbols can then be assembled into output symbols and transmitted to their destination.

In one encoding process according to aspects of the present invention, the functions used to generate the output subsymbols from the input subsymbols are XOR's of some of the input subsymbols. In another encoding process according to aspects of the present invention, these functions are obtained from a linear code defined over an extension field of GF(2) by transforming each entry in a generator or parity-check matrix of this code into an appropriate binary matrix using a regular representation of the extension field over GF(2).

In a decoder according to aspects of the present invention, output subsymbols received by the recipient are obtained from output symbols transmitted from one sender that generated those output symbols based on an encoding of an input sequence (file, stream, etc.). Because output symbols can be lost in transit, the decoder operates properly even when it only receives an arbitrary portion of the transmitted output symbols.

The present invention provides advantages such as being able to control trade offs of computational effort and transmission efficiency. For example, with relaxed optimality requirements, greatly reduced computational effort can be had for a small increase in possible transmission effort. With certain codes, additional output is readily available so that decoding failure rates can be arbitrarily reduced with reception of only relatively few additional symbols over the number of symbols required for decoding under a maximal optimality condition. In implementations, computational effort is reduced by having units of computation (boundaries between data that are part of individual coding or decoding operations) and units of loss (boundaries between data wherein if any data within a unit's boundary is unavailable, all of the data within that unit's boundary is deemed lost). In particular implementations, the unit of loss is the symbol or packet and the unit of computation is the subsymbol.

A further understanding of the nature and the advantages of the inventions disclosed herein may be realized by reference to the remaining portions of the specification and the attached drawings.

DESCRIPTION OF THE FIGURES

FIG. 3 illustrates generator matrices and comprises FIG. 3A and FIG. 3B.

DETAILED DESCRIPTION OF THE INVENTION

In the examples described herein, a coding scheme denoted as "subsymbol based coding" is described, preceded by an explanation of the meaning and scope of various terms used in this description.

An encoder is a software process, hardware apparatus, combination, or the like that receives input data from a file, stream, or other input data source and encodes that data such that effects on the data that a channel might make can be redressed by a decoder at the other end of the channel such that the decoder can regenerate the original data to whatever accuracy is needed.

With subsymbol based coding, output symbols are generated by the sender from the input file as needed. Each output symbol comprises one or more subsymbols wherein at least one output symbol comprises at least two subsymbols. Each subsymbol within an output symbol is generated by performing computational operations on subsymbols of the symbols comprising the input file, using encoder or decoder software and/or hardware. Once generated, output symbols can then be placed into packets and transmitted to their destination, with each packet containing one or more output symbols.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

Transmission is the process of transmitting data from one or more senders to one or more recipients through a channel in order to deliver a file. If one sender is connected to any number of recipients by a perfect channel, the received data can be an exact copy of the input file, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient doesn't start receiving data until some of the data has already passed it by, the recipient stops receiving data before transmission ends, or the recipient intermittently stops and starts again receiving data. As an example of data incompleteness, a moving satellite sender might be transmitting data representing an input file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range.

As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in the communication systems design, detectable errors can be the equivalent of erasures by simply dropping all data blocks or symbols that have detectable errors.

In general, transmission is the act of moving data from a sender to a recipient over a channel connecting the sender and recipient. The channel could be a real-time channel, where the channel moves data from the sender to the recipient as the channel gets the data, or the channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the channel.

1. A Basic Implementation

In a typical implementation, transmitting a file using subsymbol based coding involves generating, forming or extracting input symbols from an input file, generating subsymbols for each of the input symbols, encoding those subsymbols into one or more output subsymbols, creating output symbols from the output subsymbols, and transmitting the output symbols to one or more recipients over a channel.

Receiving (and reconstructing) a copy of the input file using subsymbol based coding involves receiving some set or subset of output symbols from one or more data streams, generating subsymbols for each of the received output symbols, decoding the input subsymbols from the values of the received output subsymbols, creating input symbols from the decoded input subsymbols, and re-assembling the input file from the input symbols. In some embodiments, the last step may be discarded, for example when the input file can be directly re-assembled from the decoded input subsymbols.

Aspects of the invention will now be described with reference to the figures.

Figure 1:
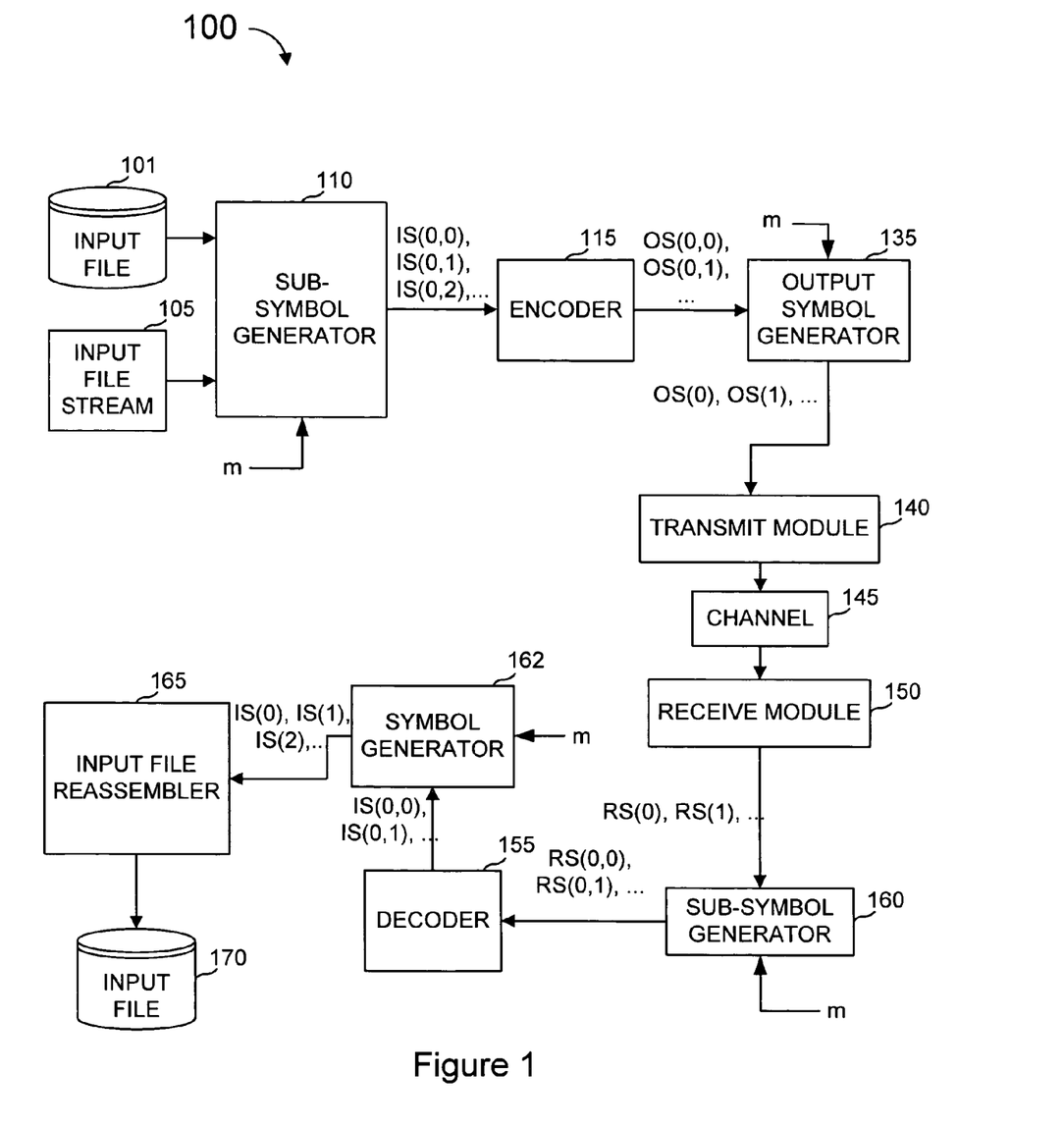
FIG. 1 is a block diagram of a communications system according to one embodiment of the present invention.

FIG. 1 is a block diagram of a communications system 100 that uses subsymbol based coding. In communications system 100, an input file 101, or an input stream 105, is provided to a subsymbol generator 110. Subsymbol generator 110 generates a sequence of one or more input subsymbols (IS(0,0), IS(0,1), IS(0,2), . . . ) from the input file or stream, with each input symbol having a value and two positions (denoted in FIG. 1 as a parenthesized integers). Subsymbol generator 110 uses as one of its inputs a value, m, which is the number of subsymbols within each input or output symbol. The output of the subsymbol generator is divided into groups of m each, and the elements of each group are identified with the second parenthesized integer, which is an integer between 0 and m−1.

As described above, the size of each input subsymbol is the computational granularity of the coding system, whereas the transmission granularity can be any number larger than or equal to m times the computational granularity. In examples provided herein, it is often assumed that the sizes of the subsymbols are all equal, for simplicity of explanation, but it should be understood that the sizes can vary and constant size is not necessary for proper functioning.

The possible values for input subsymbols, i.e., its alphabet, is typically an alphabet of $2^M$ symbols so that each input subsymbol codes for M bits of the input file. The value of M is generally determined by the use of communication system 100, but a general purpose system might include a subsymbol size input for input subsymbol generator 110 so that M can be varied from use to use. The output of input subsymbol generator 110 is provided to an encoder 115.

Encoder 115 generates output subsymbols, with values OS(i,j), from the input subsymbols provided by input subsymbol generator 110. The value of each output subsymbol is generated based on some function of one or more of the input subsymbols, referred to herein as the output subsymbol's "associated input symbols" or just its "associates". The selection of the function (the "value function") and the associates is done according to a process described in more detail below. Typically, but not always, M is the same for input subsymbols and output subsymbols, i.e., they both code for the same number of bits.

In some embodiments, the number K of input subsymbols is used by the encoder to select the associates. If K is not known in advance, such as where the input is a streaming file, K can be just an estimate. The value K might also be used by encoder 115 to allocate storage for input subsymbols.

Encoder 115 provides output subsymbols to an output symbol generator 135. Output symbol generator 135 is also provided the number m of subsymbols within each symbol. Output symbol generator 135 provides its output, shown as OS(0), OS(1), . . . , etc. in FIG. 1, to transmit module 140. Transmit module 140 transmits the output symbols over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145.

Receive module 150 provides the received symbols RS(0), RS(1), to a subsymbol generator 160. This generator is also given the value m of the number of subsymbols each received output symbol comprises. This information can be shared ahead of the transmission between the sender and the receiver, it can be part of the transmission or it can be provided later if it is not known by the receiver and the receiver does not need to decode right away. As discussed earlier, the value of m may not be the same for all the received output symbols.

Subsymbol generator 160 generates an output denoted RS(0,0), RS(0,1), . . . , etc. to decoder 155. Where each received symbol comprises m subsymbols, the output of subsymbol generator 160 is divided into groups of m each, wherein each group corresponds to the subsymbols within each received symbol. The second parenthesized integer corresponds to the position of the subsymbol within the received symbol, whereas the first integer corresponds to the received symbol of which the outputted subsymbol is a subsymbol of. In this case, the output of the subsymbol generator is RS(0, 0), . . . ,RS(0,m−1), RS(1,0), . . . , RS(1,m−1), etc.

Decoder 155 uses the output subsymbols provided by subsymbol generator 160 to recover the input subsymbols (again IS(0,0), IS(0,1), IS(0,2), . . . ). Decoder 155 provides the recovered input subsymbols to symbol generator 162, which in turn produces the input symbols IS(0), IS(1), . . . , etc. These input symbols are provided to an input file reassembler 165, which generates a copy 170 of input file 101 or input stream 105. In some applications, symbol generator 162 may be bypassed and the output directly forwarded to input file reassembler 165.

2. A Basic Encoder

Figure 2:
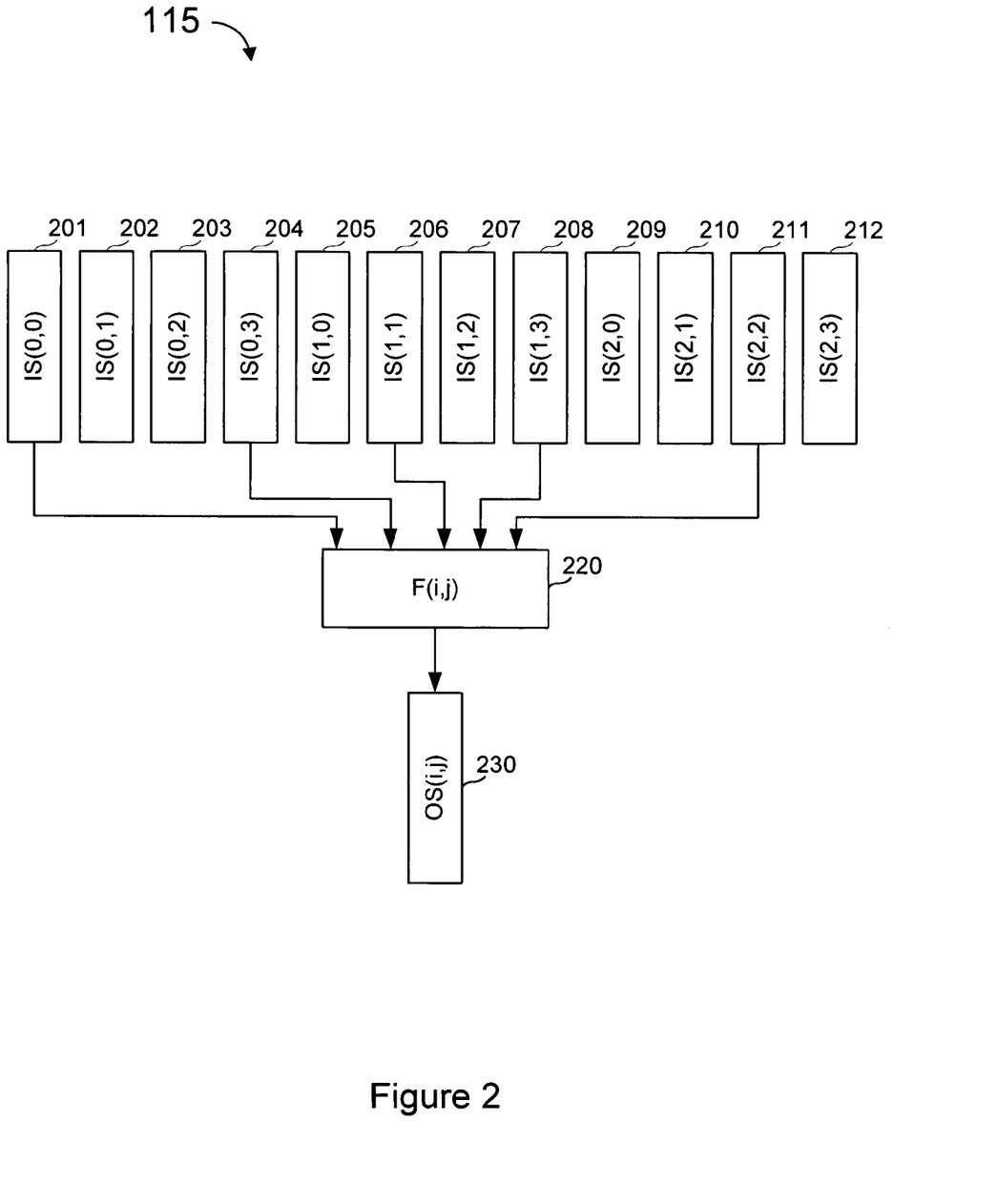
FIG. 2 is a block diagram showing a part of the encoder in FIG. 1 in greater detail.

FIG. 2 is an exemplary block diagram of a basic encoder. For each generated output symbol 230, it comprises a function evaluator 220 denoted by F(i,j). In the example of FIG. 2, m=4 and there 12 input subsymbols total, denoted by 201, . . . , 212. Function evaluator 220 computes a function of the input subsymbols to generate an output subsymbol 230. For example, in the situation depicted in FIG. 2, the function evaluator uses function F(i,j) to compute values for its output OS(i,j) from the inputs IS(0,0), IS(0,3), IS(1,1), IS(1,3) and IS(2,2).

In some embodiments, each generated output subsymbol has a different associated function, which is generated deterministically, or pseudo-randomly. In other embodiments, function evaluator 220 could be the same for many of the generated output symbols, and could differ only in the set of input values used for the function. For example, if a simple interleaving scheme is used, then F(i,j) could be the same for all the values of j, and could differ only in the set of input values. Specifically, in this case, the function F(i,j) uses only as input the subsymbols IS(0,j), IS(1,j), IS(2,j), etc.

As disclosed in FIG. 2, function evaluator 220 can be any function of its inputs. In some embodiments, in particular those where it is desirable to have a linear code, the function should be chosen to be a linear function of its arguments, e.g., an XOR of the arguments. One such class of linear functions that can be used by function evaluators 220, called "interleaved transformations" will now be described.

3. Interleaved Transformations

Some processes described herein make use of methods implicitly stated in Bloemer, Kalfane, Karp, Karpinski, Luby, and Zuckerman, "An XOR Based Erasure Resilient Coding Scheme", International Computer Science Institute (ICSI) Technical Report TR-95-048.

Consider a transformation process that transforms input data organized in s symbols into output data organized in t symbols, where each symbol (of the input data and the output data) comprises m subsymbols of the equal size and where the transformation uses a base matrix with t rows and s columns with each base matrix entry being a value in a finite field $GF(2^m)$.

The transformation process starts by transforming each entry of the base matrix into a binary matrix with m rows and m columns. This transformation utilizes the regular representation of the finite field as a GF(2) module, a concept well-known to those of ordinary skill in the arts of finite algebra and coding theory and therefore is not described here in further detail. Applying this transformation to all the entries of the original base matrix yields a new binary matrix with t*m rows and s*m columns. The transformation process applies this new matrix to the s*m subsymbols of the input data to arrive at t*m output subsymbols, one per row of the new binary matrix. Each row of the new binary matrix corresponds to one subsymbol wherein the transformation process determines a given output subsymbol by XOR'ing each input subsymbol for which there is a 1 in that row and column. The final t*m subsymbols created this way are grouped in groups of m subsymbols each to yield t symbols.

Note that the transformation process need perform only XOR's of subsymbols. The number of XOR's it performs depends on the original matrix, but this number is equal to s*t*m/2 on average.

Figure 3A:
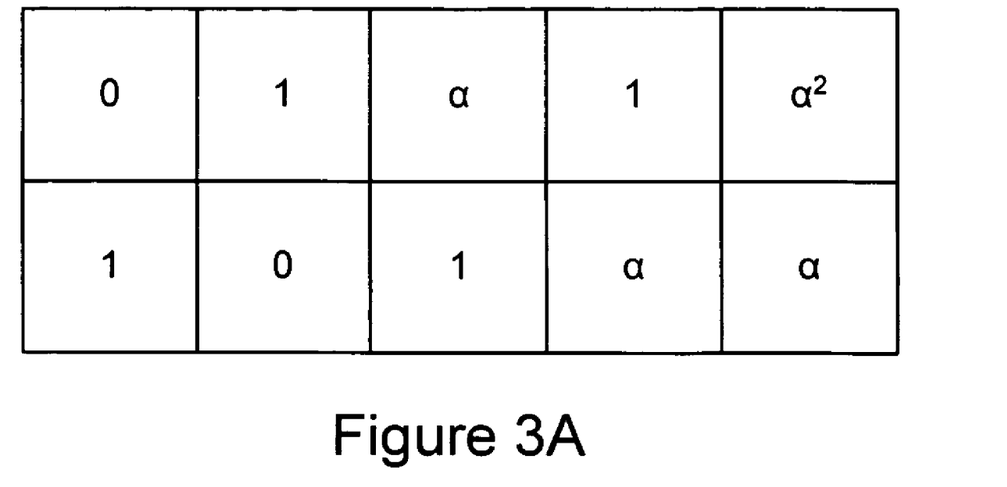
FIG. 3A illustrates a base matrix over a GF(4) field and FIG. 3B illustrates a binary generator matrix over a GF(2).

As an example of the above-described transformation process, consider the s=5 by t=2 base matrix over the field $GF(4)=\{0, 1, \alpha, \alpha 2\}$ shown in FIG. 3A. For GF(4), m=2. Using the regular representation of GF(4) over GF(2) with respect to the basis $\{1, a\}$, the base matrix of FIG. 3A is transformed into the new binary matrix shown in FIG. 3B, which is an s*m=10 column by t*m=4 row matrix.

Figure 3B:
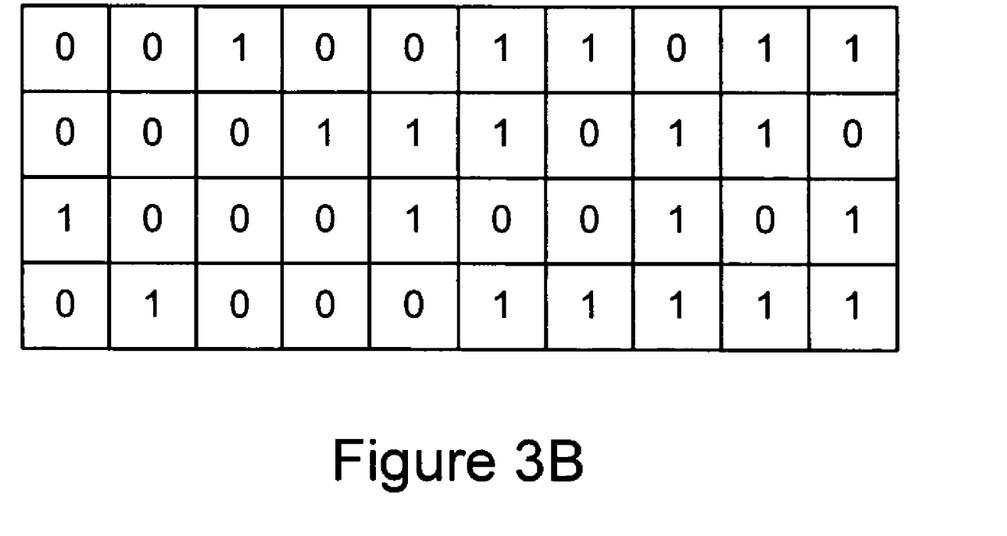

Using this transformed matrix, the original data comprising five symbols, each comprising two subsymbols, is transformed as follows: the first of the four output subsymbols is calculated as the XOR of input subsymbols 3, 6, 7, 9, 10, because those are the positions of "1"s in the first row of the matrix of FIG. 3B. Note that "1" is an arbitrary indication of one state of a binary value and thus it should be considered a label for which input symbols are used.

The second output subsymbol is calculated as the XOR of input subsymbols 4, 5, 6, 8, 9. The third output subsymbol is calculated as the XOR of input subsymbols 1, 5, 8, 10. Finally, the last (fourth) output subsymbol is calculated as the XOR of input subsymbols 2, 6, 7, 8, 9, 10. The total number of XOR's of subsymbols performed in this case is 20.

The functions F(i,j) in this particular example are given as follows:

F(0,0)=IS(1,0)+IS(2,1)+IS(3,0)+IS(4,0)+IS(4,1)
F(0,1)=IS(1,1)+IS(2,0)+IS(2,1)+IS(3,1)+IS(4,0)
F(1,0)=IS(0,0)+IS(2,0)+IS(3,1)+IS(4,1)
F(1,1)=IS(0,1)+IS(2,1)+IS(3,0)+IS(3,1)+IS(4,0)+IS(4,1)

wherein the symbol "+" denotes XOR.

Interleaved transformations can be used as part of embodiments of encoders and/or decoders using codes defined by their generator and parity-check matrices over an extension field of GF(2).

4. A Basic Output Symbol Generator

Figure 4:
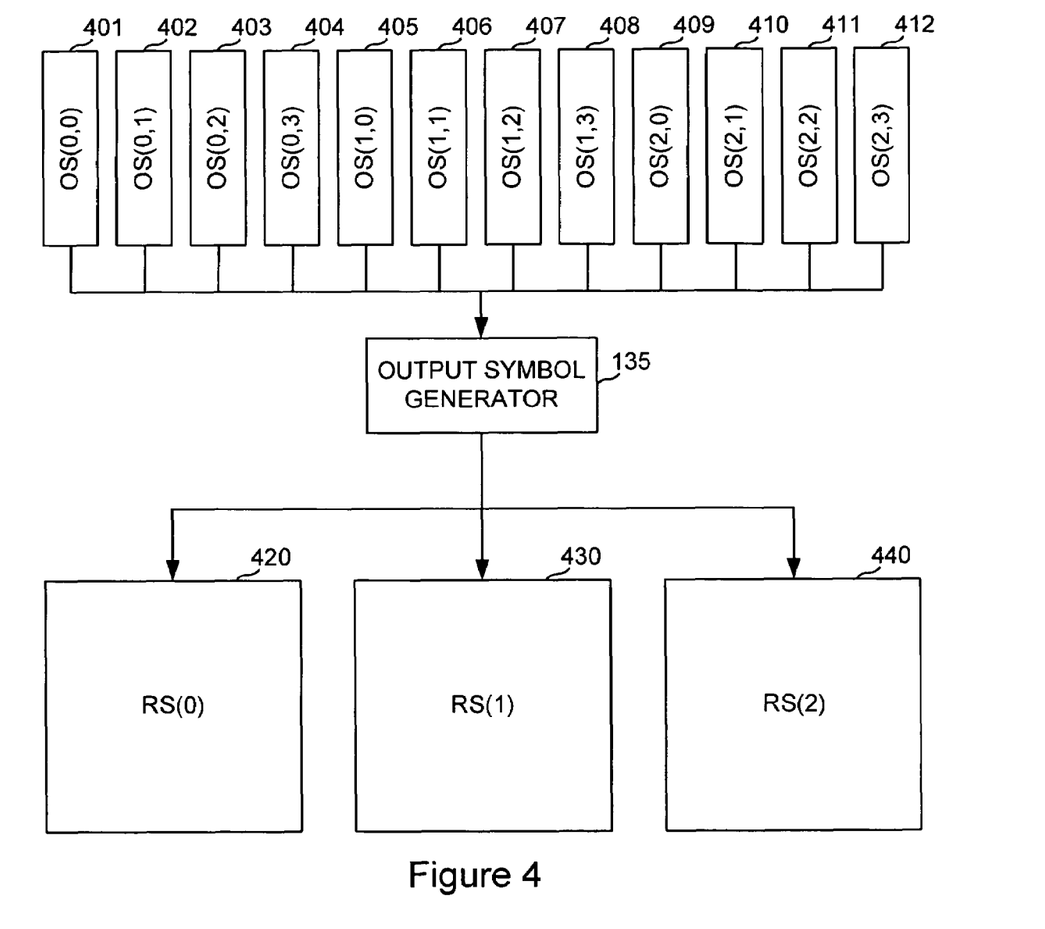
FIG. 4 is an illustration of the output symbol generator in FIG. 1.

FIG. 4 is a block diagram of the output symbol generator 135. The figure exemplifies the case of m=4, and three output symbols. In this example, the output symbol generator 135 packs groups of four output symbols, denoted OS(i,0), OS(i, 1), OS(i,2), . . . , OS(i,m−1) (referenced as 401, . . . , 412 in the figure) into output symbol OS(i) (referenced as 420, 430 and 440 in the figure). The choice of the same value m for all the output symbols is only made for simplicity. This value can be different for different output symbols, as long as the output symbol generator has an indication of what the value of m is for the output symbol to be generated.

5. A Basic Subsymbol Generator

Figure 5:
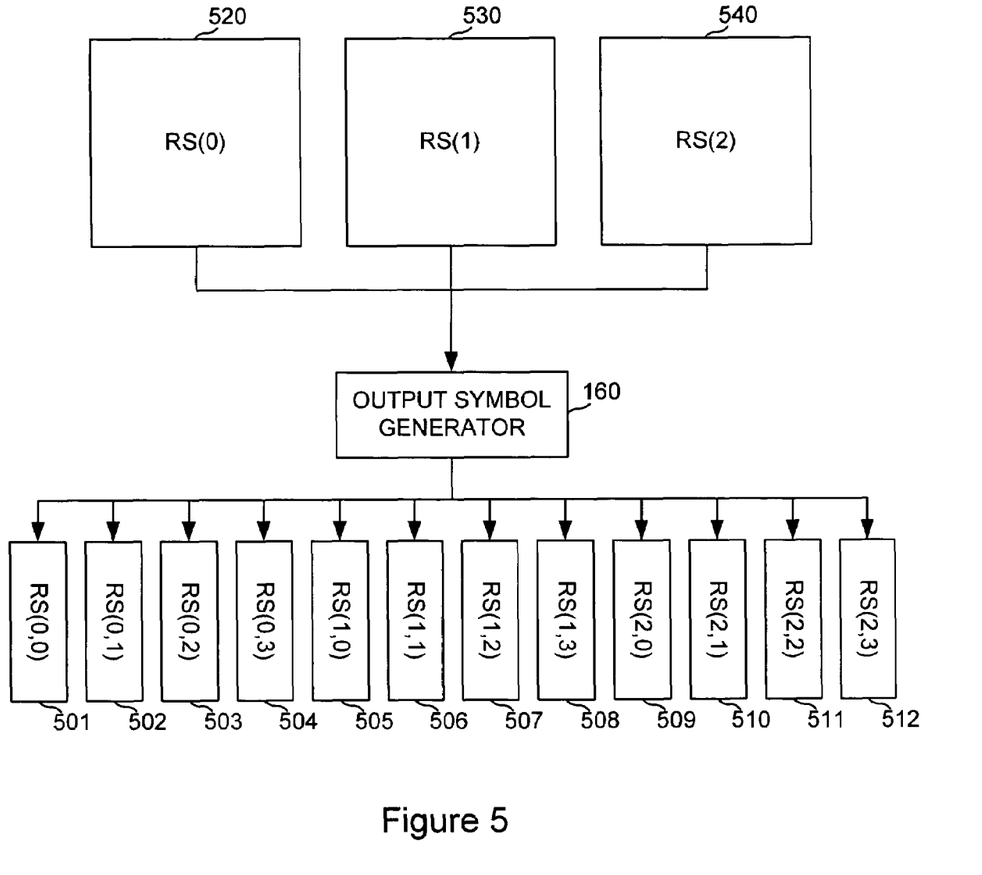
FIG. 5 is an illustration of the subsymbol generator in FIG. 1.

FIG. 5 is a block diagram of a basic subsymbol generator 160. The figure exemplifies the case of m=4, and three received symbols RS(0), RS(1), RS(2). The operation of the subsymbol generator 160 corresponds to the inverse of the operation of the output symbol generator 135 given in FIG. 4.

In the example given in FIG. 5, subsymbol generator 135 creates four subsymbols for each of the received symbols (subsymbols referenced as 501, . . . , 512 in the figure). Subsymbols RS(i,0), . . . , RS(i,3) correspond to received symbol RS(i) (referenced as 520, 530 and 540 in the figure). The choice of the same value m for all the received symbols is made for simplicity. This value can be different for different received symbols, as long as the subsymbol generator is provided, for every received symbol, an indication of what the value of m is for that symbol. Such an indication may be provided to the subsymbol generator through out-of-band information from the transmitter, or through a pre-determined algorithm shared by the transmitter and the receiver.

6. Subsymbol Based Coding Using Interleaved Transformations and Codes on Extension Fields of GF(2)

Subsymbol based coding, as described above, can be used together with interleaved transformations describe herein to design codes for transmission on packet networks with an expectation of erasures, such that the codes exhibit a desired trade off with respect to computational and erasure granularity and effort.

In one embodiment, an encoder and decoder are configured to use a code defined over the extension field $GF(2^m)$. The code may be defined by a generator matrix, a parity check matrix, or some abstract encoding process or set of rules that arrive at a similar result. For simplicity of presentation, the examples here use generator matrices to describe the coding, but it should be understood that other approaches can be used for identical, similar or different results.

Suppose the generator matrix has n rows and k columns. Assume that the code is systematic, understanding that the code can be nonsystematic instead.

With a systematic code, the sub-matrix consisting of the first k columns is the identity matrix. The sub-matrix consisting of the remaining r =n −k columns is referred to herein as C. This matrix C has r rows and k columns. Assume that the data to be encoded is k symbols (or packets) long. The encoding process is then a process of applying the interleaved transformation process above to the matrix C and the data to be encoded.

One of the advantages of this coding method as compared to previous coding methods is that the overhead properties of the transmission scheme are governed by the structure of the original code over the finite field $GF(2^m)$, while computations are performed over the field GF(2). For judicious choices of code parameters, such as is described herein or according to selection methods described herein, it is possible to obtain a coding structure providing excellent balance of the trade offs described above.

The decoding process is more elaborate because of the subsymbols and typically proceeds in steps, as described below. Notably, the decoding computational effort can still be less than if prior methods were used to obtain the same error recovery results.

In an example decoding process, assume that the encoded data packets each have associated positions and that the positions are representable by integers from 1 to n. The first k positions are called systematic positions, and the encoded data in these positions prior to transmission is identical to the data that was to be encoded. The data (or packets) in the remaining positions are called redundant packets. As before, assume that a generator matrix is given in which the first k rows form an identity matrix, and the remaining r rows form a matrix C.

In one embodiment of a decoding process, the steps are as follows:

1) Note and store the positions $q_1, q_2, \ldots, q_e$ of the erased systematic packets, where e is the number of such erased packets. If no such packets exist, declare successfull decoding and exit.
2) Set a counter l=0.
3) While decoding is not successful (i.e., all of the original packets are not yet recovered), perform substeps (a) through (e) below:
   (a) Find e+l non-erased redundant packets. Declare a decoding error if less than e+l non-erased redundant packets are available. Otherwise, denote the positions of the e+l non-erased redundant packets by $p_1, p_2, \ldots, p_{e+l}$.
   (b) Form a sub-matrix of the generator matrix comprising rows corresponding to the positions $p_1, p_2, \ldots, p_{e+l}$ and columns corresponding to the positions $q_1, q_2, \ldots, q_e$. Call this matrix D. Note that this matrix is a sub-matrix of C.
   (c) Find an invertible e×e submatrix of D, e.g., by Gaussian elimination or explicit determination or other method. If such a submatrix does not exist, then increase the counter l by one and proceed to step 3.
   (d) If such an invertible sub-matrix exists, then record its rows $r_1, r_e$, and compute its inverse over the base field, and call the inverse B.

(e) Apply the interleaved transformation process to the matrix B and the data comprising the redundant packets at positions $r_1, \ldots, r_e$ to obtain the erased systematic packets at positions $q_1, q_2, \ldots, q_e$. Declare decoding success and stop.

The following is a detailed example of this decoding process using one particular set of values. Suppose that k=16 and n=24, and suppose that after the transmission of the 24 packets, the packets at the positions 1, 2, 4, 5, 6, 7, 8, 9, 11, 12, 13, 14, 15, 16, 18, 20, 22 are received. The systematic packets at positions 3 and 10 are lost, but the other 14 are received correctly. So, $q_1=3$ and $q_2=10$. Setting the counter l to 0, 2+0=2 non-erased redundant packets are obtained. These could be packets at positions 18 and 20, so $p_1=18$, and $p_2=20$. Setting up the matrix of rows 18 and 20 and columns 3 and 10 of the generator matrix, i.e., the sub-matrix of C of rows 2 and 4 and columns 3 and 10. Suppose that the rank of this matrix is not two, so that step 3(c) is not successful. Increasing the counter l to 1 and returning back to step 3, the process continues. This time, setting $p_1=18$, $p_2=20$, and $p_3=22$ for example, and the sub-matrix of C can be formed comprising these rows of the generator matrix and columns 3 and 10. If this matrix has full rank, Step 3(*c*) will be successful and rows 1 and 3, corresponding to the non-erased systematic positions 18 and 22, will form an invertible sub-matrix. Calculating the inverse of this matrix, called B, at step 3(d) and applying the interleaved transformation process (step 3(e)) to this matrix and the data consisting of redundant packets at positions 18 and 22 yields the values of the erased packets at positions 3 and 10.

In certain embodiments, the value of l may be chosen to be some number larger than 0 in step 2. For example, this can happen if there is an expectation that for small values of l step 3(c) would not be successful. Many other variations are possible, which one of ordinary skill in the art can deduce after reading this disclosure.

7. Algebraic-Geometric Codes

One class of codes for which the processes of subsymbol decoding combined with interleaved transformations yields particularly good results is the class of Algebraic-geometric codes, or "AG codes". AG codes are extensions of Reed-Solomon codes that allow for the construction of codes that are much longer than a Reed-Solomon code over the same field. These codes are constructed using points of a curve over the finite field, and functions on the curve with prescribed poles. The construction of these codes is well-known to those of ordinary skill in the arts of finite algebra and coding theory and therefore is not described here in further detail. One of the many sources of literature for these codes is the book Goppa, V. D., "Geometry and Codes" (Kluwer Academic Publishers 1988).

AG codes share many of the properties of Reed-Solomon codes. They can often be described by explicit generator and parity-check matrices, and their minimum distance, given their dimension k and block-length n, cannot be smaller than n−k+1−g, where g is a non-negative integer that is a parameter of the underlying curve. This parameter is called the genus of the curve. Curves of genus 0 essentially yield Reed-Solomon codes, while curves of higher genus can yield substantially improved codes in terms of the block-length, albeit at the expense of smaller minimum distance.

For example, if the underlying field is GF(16), then the longest possible Reed-Solomon code has block-length 17. In contrast, it is possible to exhibit an AG-code of genus 1 that has block-length 24. The minimum distance of this code is one less than its optimal value. Such a code could be used in the following exemplary case. This case is depicted for illustrative purposes only and is not intended to limit the scope of the application.

Suppose that a piece of data that is 16 KB long is to be transmitted over a network in which packets have a payload of 1 KB. Furthermore, suppose that the data is to be protected against 33% loss. Then, using a generator matrix for the AG-code of genus 1, block-length 24, and dimension 16, and using the interleaved transformations process described above, it is possible to produce an encoded content of 24 KB. This transformation involves XOR'ing subsymbols of size 256 bytes, since each subsymbol is $\frac{1}{4}^{th}$ of a packet payload (i.e., symbol). The resulting code has the ability to decode the original 16 packets from any set of received 17 packets with probability one, and from a set of 16 received packets with a probability of roughly 96% (i.e., 96% of the possible combinations of 16 packets are such that the original 16 packets are decodable from that combination).

AG-codes can be made to be systematic. For example, in the above case, the first 16 KB of the encoded data can be equal to the original 16 KB, with the additional 8 KB representing redundant data. To produce this redundant data, the interleaved transformation process described above is applied to a matrix with 8 rows and 16 columns. In such a case, the number of XOR's of subsymbols to produce the redundant data is, on average, 8*16*4/2, or 256. After this operation, the produced coded data comprises 96 subsymbols, so that the number of XOR's of subsymbols per generated subsymbol is 256/96, or slightly less than 3.

If a Reed-Solomon code were used in the above, then the smallest possible field extension that is a power of two on which the Reed-Solomon code is defined needed to be GF(256). In that case, the subsymbols would be half as large as in the previous case and it requires 8*16*8/2=512 XOR's of subsymbols, on average, to produces the redundant data, which in turn translates to half the encoding speed of the previous case.

Below, some AG-codes are described that could be used for the transmission of content of size up to 64 KB on a packet based network with packet payload size of 1 KB. These examples serve only for illustrative purposes and should not be construed to limit the scope of the present invention. The examples are parameterized by the length of the encoded content, rather than the length of the original content. The transition to the latter can be made through the desired protection loss rate. For example, where the length of the encoded content is 24 KB and there is an expectation of 25% loss, then the length of the original content can be set equal to 18 KB.

For an encoded content size of up to 8 KB, it is possible to use an AG code from an elliptic curve over GF(4) with the largest possible number of nine rational points. An example of such a curve is the Hermitian curve. The code corresponding to this curve guarantees that it is possible to recover the content from an excess of at most one additional packet. A Reed-Solomon code for this task would have to operate in the field GF(16) and would have roughly half the encoding and decoding speed of the AG code constructed in this example.

For an encoded content size of up to 24 KB, it is possible to use an AG code from an elliptic curve over GF(16) with the largest possible number of 25 rational points. Such curves are well-known to those of ordinary skill in the art, and the corresponding codes can be constructed easily. For these codes, there is a guarantee that the index l in the decoding process of described above will never exceed one. In other words, if the number of received packets is one larger than the number of original packets, then the decoding process will succeed. However, if the number of received packets is equal to the number of original packets, there is a certain probability of failure associated to the decoder. This probability can be mathematically computed in this case and is roughly equal to $\frac{1}{25}$, which is 4%.

For an encoded content size of up to 32 KB, it is possible to use an AC code from a maximal hyperelliptic curve of genus 2 over GF(16) with 33 points. This curve is also well-known to those of ordinary skill in the art, as is the construction of the associated code. In this case, the index l in the above process will never exceed 2. For an encoded content size of up to 37 KB, it is possible to use an AG code from a maximal curve of genus 3 over GF(16) with 38 points. In this case, the index l in the above process will never exceed 3. For an encoded content size of up to 44 KB, it is possible to use an AG code from a maximal curve of genus 4 over GF(16) with 38 points. In this case, the index l in the above process will never exceed 4. For an encoded content size of up to 64 KB, it is possible to use the Hermitian curve over GF(16) with 65 rational points. In this case, the index l will never exceed the value of 6.

In each of the above cases, recovery of the original content comprising k packets is possible with a good probability from any k received packets, and the probability rapidly increases as the number of received packets exceeds of k, reaching a probability of 1 if the excess is equal to the genus of the curve used.

8. Random Codes

The processes of subsymbol based coding combined with interleaved transformations are by no means particular to block codes. In general, the teachings of the present invention can benefit from any code over a finite field $GF(2^m)$ or even more generally, any code over any finite field GF(q). For example, the processes can be combined with random codes for a beneficial effect.

Random codes can be used as block codes, or similar to chain reaction codes, for which the number of output symbols that can be generated is not fixed in advance and can be orders of magnitude larger than the number of input symbols. In particular, the number of output symbols possible can be larger than any expected loss pattern such that a transmitter (or set of transmitters, possibly uncoordinated) does not repeat output symbols over a time expected for successful transmission. While no physical process can truly be infinite and repeatable, chain reaction codes can be easily employed, as described in Luby I or elsewhere, such that the number of output symbols for a given input sequence is effectively unlimited. Because unrelated sequences of output symbols are very unlikely to overlap (due to the large space of output symbols for a given input sequence), these codes are sometimes referred to as "information additive codes".

For random block codes, the generator matrix is obtained by choosing elements in GF(q) randomly or pseudo-randomly. It should be understood that, as used herein, "random" might also encompass "pseudo-random" but is not explicitly stated everywhere to improve readability of the disclosure. The size q of the field is responsible for rank properties of the matrix. In general, the larger q, the higher the probability that a matrix of given dimensions has full rank. The success of step 3(c) in the decoding process described above is determined by the rank properties of the matrix.

For random chain reaction codes over GF(q), each output symbol is generated using a key, as described in Luby I and Shokrollahi I. For each key, a subset of the input symbols is chosen together with a random or pseudo-random element in the field GF(q) for each of the input symbol elements chosen. Conceptually, a vector is formed comprising the chosen values in GF(q) and zeros for those positions corresponding to input symbols not chosen, and the process of subsymbol based coding combined with interleaved transformations is applied to this matrix. The intermediate step of creating the matrix is purely conceptual and may be omitted entirely in applications.

As an example, consider again the case of codes over GF(16). A random matrix with k rows and k columns is invertible over GF(16) with a probability that is roughly equal to 93%. (It should be understood that wherever something herein is described as "random", "pseudorandom" will also apply, unless otherwise indicated.) This means that in applying the decoding process described above, in 93% of the cases the counter l remains at 0, so no reception of data in excess of the size of original data is required. A random matrix with k rows and k+1 columns has rank k with probability roughly equal to 99.5%. This means that the counter l will reach 2 only in 0.5% of the cases. Similarly, the probability that l never exceeds 2 is roughly 99.97%, the probability that l never exceeds 3 is roughly 99.998%, the probability that it never exceeds 4 is 99.99998%, and so on, and the probability that it exceeds 6 is about $4 \times 10^{-9}$. Table 1 shows the error probability of the decoder for various other values of the number of excess packets received. The data in Table 1 shows that it is possible to construct random codes that have very good overheads, with more efficient encoding and decoding algorithms than Reed-Solomon codes, since they are built over smaller fields.

TABLE 1

| Excess packets received | Decoding error prob. |
| --- | --- |
| 0 | $6.6 \times 10^{-2}$ |
| 1 | $4.2 \times 10^{-3}$ |
| 2 | $2.7 \times 10^{-4}$ |
| 3 | $1.7 \times 10^{-5}$ |
| 4 | $1.2 \times 10^{-6}$ |
| 5 | $6.4 \times 10^{-8}$ |
| 6 | $4.0 \times 10^{-9}$ |
| 7 | $2.5 \times 10^{-10}$ |
| 8 | $1.6 \times 10^{-11}$ |
| 9 | $9.8 \times 10^{-13}$ |
| 10 | $6.1 \times 10^{-14}$ |

Similar results occur with the field GF(4). Table 2 shows the error probability of the decoder as a function of the number of excess packets received for GF(4). Note that GF(4) increase the encoding and decoding speeds by a factor of two compared to codes over GF(16).

TABLE 2

| Excess packets received | Decoding error prob. |
| --- | --- |
| 0 | $3.1 \times 10^{-1}$ |
| 1 | $8.2 \times 10^{-2}$ |
| 2 | $2.1 \times 10^{-2}$ |
| 3 | $5.2 \times 10^{-3}$ |
| 4 | $1.3 \times 10^{-3}$ |
| 5 | $3.3 \times 10^{-4}$ |
| 6 | $8.2 \times 10^{-5}$ |
| 7 | $2.1 \times 10^{-5}$ |
| 8 | $5.1 \times 10^{-6}$ |
| 9 | $1.3 \times 10^{-6}$ |
| 10 | $3.2 \times 10^{-7}$ |

The above numbers suggest that information additive codes based on random codes over GF(4) or GF(16) perform excellently even at very small overheads.

While several examples are shown of non-Reed-Solomon coding used with interleaved transformation, other non-Reed-Solomon base matrices might work as well.

Variations

In some variations, encoders operate in parallel to generate output symbols more quickly. In order to obtain certain benefits of subsymbol operations, parallel encoder modules should be interdependent rather than operating totally independently. For example, the parallel encoder is would coordinate selection of subsymbol sets over multiple input symbols for application of the value function, such that subsymbols are mixed over multiple input symbols and from different subsymbol positions within input symbols.

Conclusions

Subsymbol based coding which can operate with fewer arithmetic operations than a Reed-Solomon code. We have noted that such codes do not exist if the optimally condition is required, but by relaxing that requirement, interesting codes become possible. While it can be shown that for such codes one would have to lose the optimality condition in terms of the number of output symbols necessary to receive in order to be able to decode the original content, some classes of codes exhibit reasonable statistical properties which show that in most of the cases they perform similarly to the Reed-Solomon code, and in only very few cases do they require extra symbols to recover the original content.

With the observation that absolute optimality is not always a requirement and does not always lead to complete recovery of data anyway, close to optimal transmission efficiency that is good enough can often be had with considerably less computational effort. For example, using codes with smaller alphabets greatly reduces computational effort while causing only slight relaxation from absolute optimality.

In some preferred embodiments, sets of instructions (or software) to perform the communication processes described above are provided to two or more multi-purpose computing machines that communicate over a possibly lossy communications medium. The number of machines may range from one sender and one recipient to any number of machines sending and/or receiving. The communications medium connecting the machines may be wired, optical, wireless, or the like. The above-described communications systems have many uses, which should be apparent from this description.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of transmitting data from a source to a destination over a communication channel wherein the data to be transmitted is arranged into an ordered set of input symbols, the method further comprising:

designating input subsymbols of the data, wherein an input subsymbol is a portion or all of an input symbol and at least one input symbol is divided into two or more subsymbols such that each input subsymbol can be identified by an index unique within its input symbol;

generating a plurality of output subsymbols from the input subsymbols, wherein an output subsymbol is generated from one or more input subsymbol using a value function and a set of associates, the set of associates identifying the input subsymbols to which the value function is applied, wherein at least one output subsymbol is a function of a plurality of input subsymbols of one input symbol, each input subsymbol being identified by different indices within that one input symbol;

generating a plurality of output symbols from the generated plurality of output subsymbols, wherein the plurality of output symbols is such that, for at least one possible set of received output symbols of equal size to the encoded input symbols, additional received output symbols are required to completely decode received output symbols to regenerate the encoded input symbols; and transmitting the plurality of output symbols over the communication channel, such that a recipient can regenerate the ordered set of input symbols from some or all of the plurality of output symbols.

2. The method of claim 1, wherein the number of possible output symbols for a given set of input symbols is effectively independent of the number of output symbols needed to regenerate the set of input symbols.

3. The method of claim 1, wherein at least one output subsymbol is generated from more than one input subsymbol and from less than all of the input subsymbols in the input subsymbols in the set of associates and from less than all of the subsymbols in at least one input symbol.

4. The method of claim 1, wherein each of the input symbols are divided into a common number of subsymbols and the common number is greater than one.

5. The method of claim 1, wherein the value function is the same for all output subsymbols.

6. The method of claim 1, wherein the value function is different for at least two output subsymbols.

7. The method of claim 1, wherein the set of associates are determined using a chain reaction ending code encoding process.

8. The method of claim 1, wherein the value function is a linear function of the set of associates.

9. The method of claim 8, wherein the linear function is derived using an interleaved transformation process.

10. The method of claim 1, wherein the value function varies for at least two different output subsymbols, and is a linear function of the set of associates derived using an interleaved transformation process wherein a plurality of value functions is obtained using the interleaved transformation process applied to a generator matrix of a code defined over a finite field of degree at least two over its prime field.

11. The method of claim 10, wherein the code is an Algebraic-Geometric code defined over a curve of genus larger than zero.

12. The method of claim 10, wherein the code is a random code.

13. The method of claim 10, wherein the code is a chain reaction code defined over a finite field that is an extension of degree at least two over its prime field.

14. The method of claim 13, wherein the chain reaction code is a random chain reaction code.

15. A method of encoding data comprising s input symbols, where s is an integer greater than one, into t symbols, where t is an integer greater than one, the method comprising:

obtaining a base matrix of t rows and s columns, wherein the base matrix entries are members of a finite field $GF(2^m)$ and the base matrix forms other than a Reed-Solomon base matrix;

generating an expansion binary matrix from the base matrix by substituting for each entry of the base matrix a regular representation of a finite field as a GF(2)-module, thereby generating a binary matrix of t*m rows and s*m columns;

dividing each of the s input symbols into m subsymbols of the same size, wherein m is greater than one;

operating on the s*m input subsymbols using the expansion binary matrix to form t*m output subsymbols, and grouping groups of m output subsymbols into output symbols, thus forming t output symbols that, together with the s input symbols is usable as error-correction for the s input symbols.

16. The method of claim 15, wherein the base matrix represents an algebraic-geometric code based on a curve of genus greater than zero.

* * * * *